(12) United States Patent
Burke et al.

(10) Patent No.: US 6,287,927 B1
(45) Date of Patent: Sep. 11, 2001

(54) METHODS OF THERMAL PROCESSING AND RAPID THERMAL PROCESSING

(75) Inventors: Robert Burke; Mark Eyolfson, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/488,974

(22) Filed: Jan. 20, 2000

Related U.S. Application Data

(62) Division of application No. 09/070,534, filed on Apr. 29, 1998, now Pat. No. 6,090,677.

(51) Int. Cl.[7] .................................................. H01L 21/336
(52) U.S. Cl. ........................ 438/308; 438/612; 438/618
(58) Field of Search ..................................... 438/308, 612, 438/618, 795; 437/184, 228

(56) References Cited

U.S. PATENT DOCUMENTS

| | | | |
|---|---|---|---|
| 5,036,023 | 7/1991 | Dautremont-Smith et al. | 437/184 |
| 5,336,641 | 8/1994 | Fair et al. | 437/248 |
| 5,439,850 | 8/1995 | Oztürk et al. | 437/228 |
| 5,523,262 | 6/1996 | Fair et al. | 427/248 |

Primary Examiner—Charles Bowers
Assistant Examiner—Scott J. Hawranek

(74) Attorney, Agent, or Firm—Wells, St. Johns, Roberts, Gregory & Matkins, P.S.

(57) ABSTRACT

In one aspect, the invention includes a method of thermal processing comprising: a) providing a semiconductor substrate, the semiconductor substrate supporting a material that is to be thermally processed; b) forming a sacrificial mass over the material, the mass comprising an inner portion and an outer portion, the inner portion having a different composition than the outer portion and being nearer the material than the outer portion; c) exposing the mass to radiation to heat the mass, the exposing being for a period of time sufficient for the material to absorb heat from the mass and be thermally processed thereby; and d) removing the mass from over the material. In another aspect, the invention includes a method of thermal processing comprising: a) providing a semiconductor substrate, the substrate supporting a material that is to be thermally processed; b) forming a first sacrificial layer over the material; c) forming a second sacrificial layer over the first sacrificial layer, the second sacrificial layer comprising a different composition than the first sacrificial layer; d) exposing the second sacrificial layer to radiation to heat the second layer, the exposing being for a period of time sufficient for the material to absorb heat from the sacrificial layer and be thermally processed thereby; e) cooling the material and the sacrificial layers; and f) removing the sacrificial layers from over the material.

26 Claims, 2 Drawing Sheets

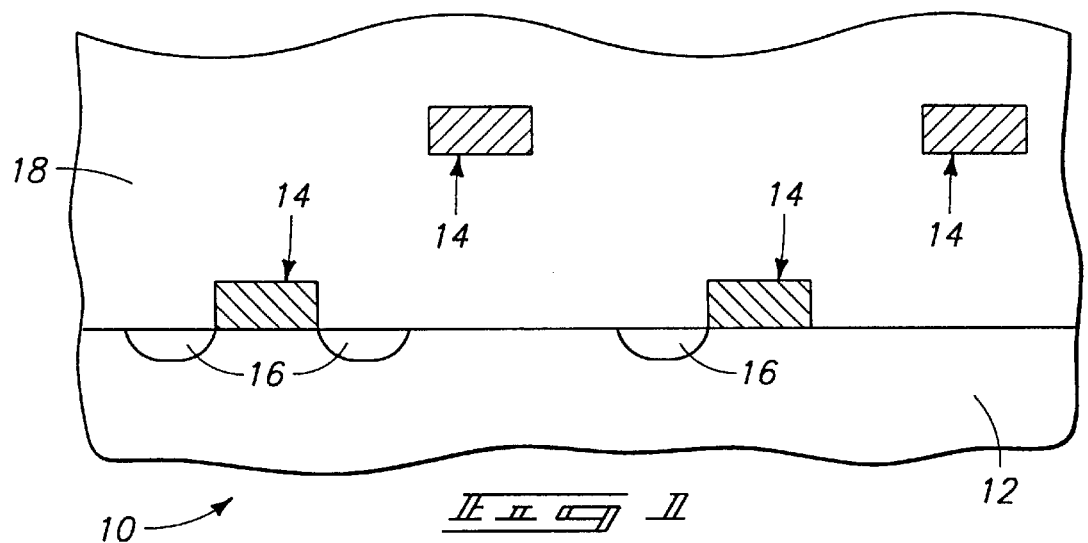
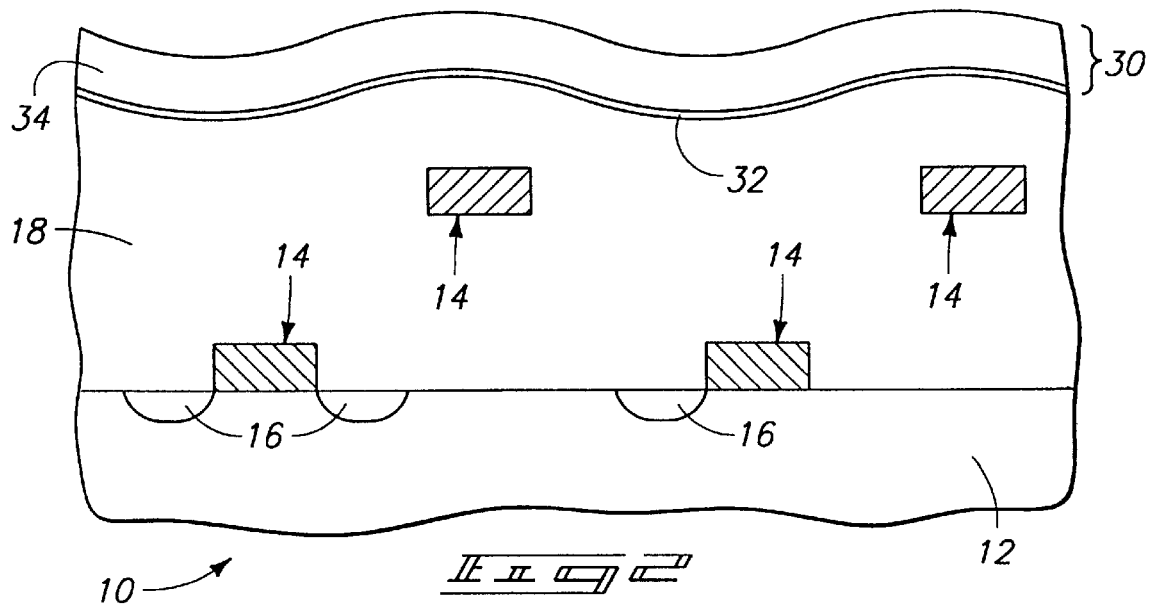

METHODS OF THERMAL PROCESSING AND RAPID THERMAL PROCESSING

RELATED PATENT DATA

This patent resulted from a divisional application of U.S. patent application Ser. No. 09/070,534, which was filed on Apr. 29, 1998 now U.S. Pat. No. 6,090,677.

TECHNICAL FIELD

The invention pertains to semiconductor fabrication methods employing thermal processing and rapid thermal processing.

BACKGROUND OF THE INVENTION

Thermal processing is widely utilized in semiconductor fabrication. An example use of thermal processing is dopant activation. A dopant provided in, for example, polysilicon or a monocrystalline silicon substrate, is exposed to temperatures of from about 900° C. to about 1,000° C. to improve conductivity-enhancing properties of the dopant. Another example use of thermal processing is an anneal, wherein, for example, amorphous silicon is treated at a processing temperature in excess of 1,000° C. to convert the amorphous silicon to polycrystalline silicon. Thermal annealing can also be utilized in treating, for example, metal/silicon interfaces to form metal silicide. Another example use of thermal processing is to melt and reflow materials. For instance, borophosphosilicate glass (BPSG) can be thermally treated at temperatures of from about 800° C. to about 1,100° C. to melt and reflow the BPSG. Such melting and reflow can create a substantially planarized outer surface of the BPSG, which can be desirable for further processing applications.

A particular method of thermal processing is rapid thermal processing (RTP), wherein a material is processed from one temperature to another temperature at a ramp rate of greater than about 20° C./second, and typically greater than about 25° C./second. RTP can be preferred over other forms of thermal processing. For example, thermal processing occurring at temperatures of greater than 900° C. can cause unwanted dopant diffusion. RTP can alleviate such unwanted dopant diffusion by reducing the time during which a semiconductive wafer is exposed to high temperature processing conditions.

RTP is typically conducted by exposing a wafer to a beam of radiant energy. Standard sources of the radiant energy are xenon lamps and mercury lamps. Typically, the radiant energy is in the form of light having a wavelength of from about 0.8 microns to about 2.5 microns. After the exposure to the light, the wafer is allowed to cool by diffusion of heat from the wafer to its surroundings. Wafers typically cool at a rate of at least about 20° C./second by such diffusion.

A difficulty of thermal processing methods generally, and rapid thermal processing methods particularly, is in maintaining temperature uniformity across a wafer surface during the thermal treatment. For instance, during an RTP process a wafer surface is heated by energy transfer from a radiant energy source. Frequently, some portions of the wafer surface will heat more readily than other portions, resulting in non-uniform thermal conditions across the wafer surface. It would be desirable to develop alternative methods of thermal processing wherein such non-uniform thermal conditions could be substantially alleviated.

SUMMARY OF THE INVENTION

In on e aspect, the invention encompasses a method of thermal processing. A semiconductor substrate supporting a material that is to be thermally processed is provided. A sacrificial mass is formed over the material. The mass comprises an inner portion and an outer portion, with the inner portion having a different composition than the outer portion and being nearer the material than the outer portion. The mass is exposed to radiation to heat the mass. The exposing is for a period of time sufficient for the material to absorb heat from the mass and be thermally processed thereby. The mass is then removed from over the material.

In another aspect, a semiconductor substrate supporting a material that is to be thermally processed is provided. A first sacrificial layer is formed over the material. A second sacrificial layer is formed over the first sacrificial layer. The second sacrificial layer comprises a different composition than the first sacrificial layer. The second sacrificial layer is exposed to radiation to heat the second layer. The exposing is for a period of time sufficient for the material to absorb heat from the sacrificial layer and be thermally processed thereby. The material and the sacrificial layers are cooled. The sacrificial layers are then removed from over the material.

BRIEF DESCRIPTION OF THE DRAWINGS

Preferred embodiments of the invention are described below with reference to the following accompanying drawings.

FIG. 1 is a cross-sectional, fragmentary, diagrammatic view of a semiconductor wafer fragment at a preliminary processing step of a method of the present invention.

FIG. 2 is a view of the FIG. 1 wafer fragment at a processing step subsequent to that of FIG. 1.

DETAILED DESCRIPTION OF THE PREFERRED EMBODIMENTS

Figure 3:
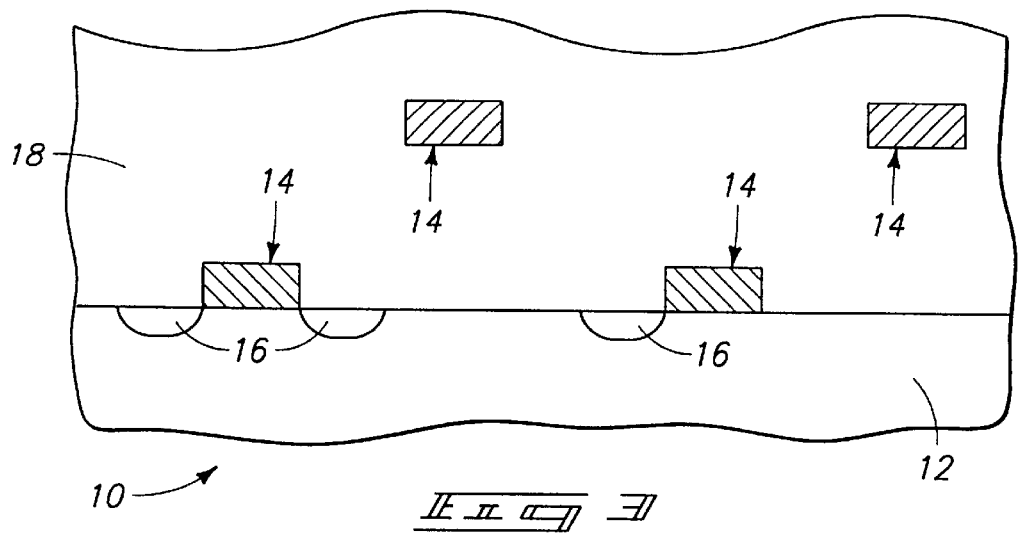
FIG. 3 is a view of the FIG. 1 wafer fragment at a processing step subsequent to that of FIG. 2.

This disclosure of the invention is submitted in furtherance of the constitutional purposes of the U.S. Patent Laws "to promote the progress of science and useful arts" (Article 1, Section 8).

A method of the present invention is described with reference to FIGS. 1–3. FIG. 1 illustrates a semiconductor wafer fragment 10 at a preliminary process step. Wafer fragment 10 comprises a substrate 12 and circuit components 14 formed thereover. Circuit components 14 can comprise, for example, transistors, resistors, conductive lines and/or capacitors. Substrate 12 can comprise, for example, monocrystalline silicon lightly doped with a p-type background conductivity-enhancing dopant. Alternatively, substrate 12 can comprise, for example, gallium-arsenide. To aid in interpretation of the claims that follow, the term "semiconductive substrate" is defined to mean any construction comprising semiconductive material, including, but not limited to bulk semiconductive materials such as a semi-conductive wafer (either alone or in assemblies comprising other material thereon), and semiconductive material layers (either alone or in assemblies comprising other materials). The term "substrate" refers to any supporting structure, including, but not limited to, the semiconductor substrates described above.

Wafer fragment 10 also comprises diffusion regions 16 extending into substrate 12. Diffusion regions 16 can comprise, for example, a conductivity-enhancing dopant provided to a concentration of greater than $10^{19}$ atoms/cm$^3$.

An insulative material 18 extends over substrate 12. In the shown exemplary embodiment, some of conductive components 14 are received entirely within insulative material 18, and some of conductive components 14 are against a top surface of substrate 12 and covered by insulative material 18. Insulative material 18 can comprise, for example, a silicon oxide, such as silicon dioxide or BPSG.

One or more of conductive components 14, diffusion regions 16, or insulative material 18 requires thermal processing in the shown exemplary fabrication process. For instance, at least one of conductive components 14 can be initially formed as amorphous silicon and require thermal processing to convert it to polycrystalline silicon. As another example, one or more of diffusion regions 16 can require thermal processing to activate dopant within such diffusion regions. Also, one or more of conductive components 14 can comprise conductively doped polycrystalline silicon, and require thermal processing to activate the conductivity-enhancing dopant of the conductively doped polycrystalline silicon. As another example, insulative material 18 can require thermal processing to melt and reflow the insulative material into a planar structure more suitable for subsequent process steps. As yet another example, one or more of components 14 can comprise a metal layer adjacent silicon and require thermal processing to form a metal silicide.

Referring to FIG. 2, wafer fragment 10 is prepared for thermal processing by providing a sacrificial mass 30 over insulative material 18. Sacrificial mass 30 comprises an inner portion 32 and an outer portion 34. In a preferred embodiment, insulative material 18 comprises a silicon oxide, such as, for example, silicon dioxide. Outer portion 34 of sacrificial mass 30 preferably comprises a metal that can withstand high temperature processing, such as, for example, silver, gold, titanium or tungsten, and inner portion 32 preferably comprises titanium nitride for adhering the metal of outer portion 34 to the silicon oxide of insulative layer 18. For purposes of interpreting this disclosure and the claims that follow, the term "metal" is defined as a conductive material, which can be, for example, in the form of an alloy, or in an elemental form, and which does not consist of conductively doped silicon.

Although in the shown exemplary embodiment insulative material 18 extends from a surface of substrate 12 to inner portion 32 of sacrificial mass 30, in other embodiments (which are not shown) insulative layer 18 can comprise a thin layer of oxide formed over another material extending between substrate 12 and insulative layer 18. Such other material can comprise either a conductive material or insulative material. For instance, such other material could be an insulative material, such as, for example, silicon nitride.

Sacrificial mass 30 can alternatively be considered as comprising a first sacrificial layer 32 and a second sacrificial layer 34 over the first sacrificial layer 32. In the shown preferred embodiment, second sacrificial layer 34 is physically against first sacrificial layer 32. However, in other embodiments (which are not shown) layers 32 and 34 may be separated by intervening sacrificial layers, such as, for example, other metal-comprising layers. An example embodiment in which sacrificial mass 30 comprises three layers is an embodiment in which a sacrificial barrier layer (not shown) is provided over insulative layer 18, and in which layers 32 and 34 are formed over the sacrificial barrier layer. The sacrificial barrier layer can comprise, for example, silicon oxide or silicon nitride, and can be provided to alleviate chemical interaction between layer 32 and insulative layer 18. First layer 32 preferably comprises a thickness of from about 150 Angstroms to about 500 Angstroms, and second layer 34 preferably comprises a thickness of at least at about 500 Angstroms.

Sacrificial mass 30 can be formed by, for example, chemical vapor deposition of titanium nitride to form inner portion 32, followed by sputter deposition of a metal to form outer portion 34.

After formation of sacrificial mass 30, wafer fragment 10 is subjected to thermal processing. Such thermal processing can comprise exposing sacrificial mass 30 to radiant energy to heat the mass. Heat can then transfer from mass 30 to the underlying materials of layer 18, components 14, diffusion region 16, and substrate 12 to thermally process such materials. The radiant energy can comprise, for example, light having a wavelength of from about 0.8 to about 2.5 microns, such as light emitted by, for example, a mercury or xenon lamp. Wafer 10 can be within a chamber filled with an atmosphere during exposure of wafer 10 to radiant energy. The atmosphere can be inert to reaction with mass 30 or any other portions of wafer 10 that contact the atmosphere. Example components of such inert atmosphere can include argon and/or nitrogen. Alternatively, the atmosphere can be reactive with outer portion 34 of mass 30 to form an outer sacrificial layer (not shown) over outer portion 34, effectively adding another layer to mass 30. Example components of a reactive atmosphere can be nitrogen (which can form a metal-nitride, such as, for example, titanium nitride from a metal-comprising portion 34) and/or oxygen (which can form a metal-oxide, such as, for example, titanium oxide from a metal-comprising portion 34).

The exposure of sacrificial mass 30 to the radiant energy occurs for a period of time sufficient for materials underlying sacrificial mass 30 to absorb heat and be thermally processed by the heat. The period of exposure can be adjusted to compensate for a depth of a material that is to be thermally processed. Generally, it will take longer for heat to transfer from sacrificial mass 30 to materials that are deeply buried beneath the mass than to materials that are closer to the mass. Exemplary exposure times are from about 5 seconds to about 1 minute, with about 20 seconds being typical.

The thermal treatment can comprise a temperature of from about 800° C. to about 1100° C., more preferably comprises a temperature of at least about 800° C., and even more preferably comprises a temperature of from about 900° C. to about 1000° C. The thermal processing preferably comprises rapid thermal processing, with outer portion 34 preferably heating at a ramp rate of from about 25° C./second to about 50° C./second.

Metal layer 34 of mass 30 acts as a heat sink to evenly distribute heat across an outer surface of wafer fragment 10 during thermal processing of the wafer fragment. Accordingly, sacrificial mass 30 can alleviate the prior art problem of non-uniform heating of a wafer surface during thermal treatment. Metals utilized in sacrificial layer 30 can be particularly effective heat sinks relative to other materials commonly utilized in semiconductor wafer fabrication processes, such as oxides, nitrides, or silicon. Accordingly, the utilization of a metal-comprising sacrificial mass 30 in thermal treatments of the present invention can be more effective for evenly distributing heat across a surface of a wafer than other surface layers that would typically exist during prior art semiconductor fabrication processes.

Radiation absorption by sacrificial mass 30 is typically independent of underlying oxide thickness and circuit density. Also, the energy absorption of metal-comprising mass 30, and heat transfer form mass 30, can overwhelm subtle wafer-to-wafer thermal variations that may occur due to minor processing variations. Thus, mass 30 can provide consistent thermal processing, regardless of wafer-to-wafer processing variations. Adjustments to thermal processing can, however, be utilized if the location of materials that are to be thermally processed is varied substantially relative to the location of insulative mass 30.

After the thermal processing, sacrificial mass 30 is cooled, as are the materials underlying sacrificial mass 30, to end the thermal processing.

Referring to FIG. 3, sacrificial mass 30 is removed from over material 18 to complete the processing of the present invention. An exemplary method for removing sacrificial mass 30 is a wet etch comprising ammonia, hydrogen peroxide and water.

It is noted that the above-discussed thicknesses of layers 32 and 34 are exemplary thicknesses only, and can be adjusted for particular applications. For instance, if a thermal processing application comprises reflow of a BPSG layer underlying sacrificial mass 30, the relative thicknesses of the BPSG layer and the sacrificial mass can be adjusted to reduce stresses that would otherwise occur as the BPSG reflows under sacrificial mass 30. Preferably, however, outer portion 34 of insulative mass 30 will be provided to be thick enough to be opaque to the radiation provided against outer portion 34 during the thermal processing. Accordingly, outer portion 34 is preferably at least about 500 Angstroms thick.

Figure 4:
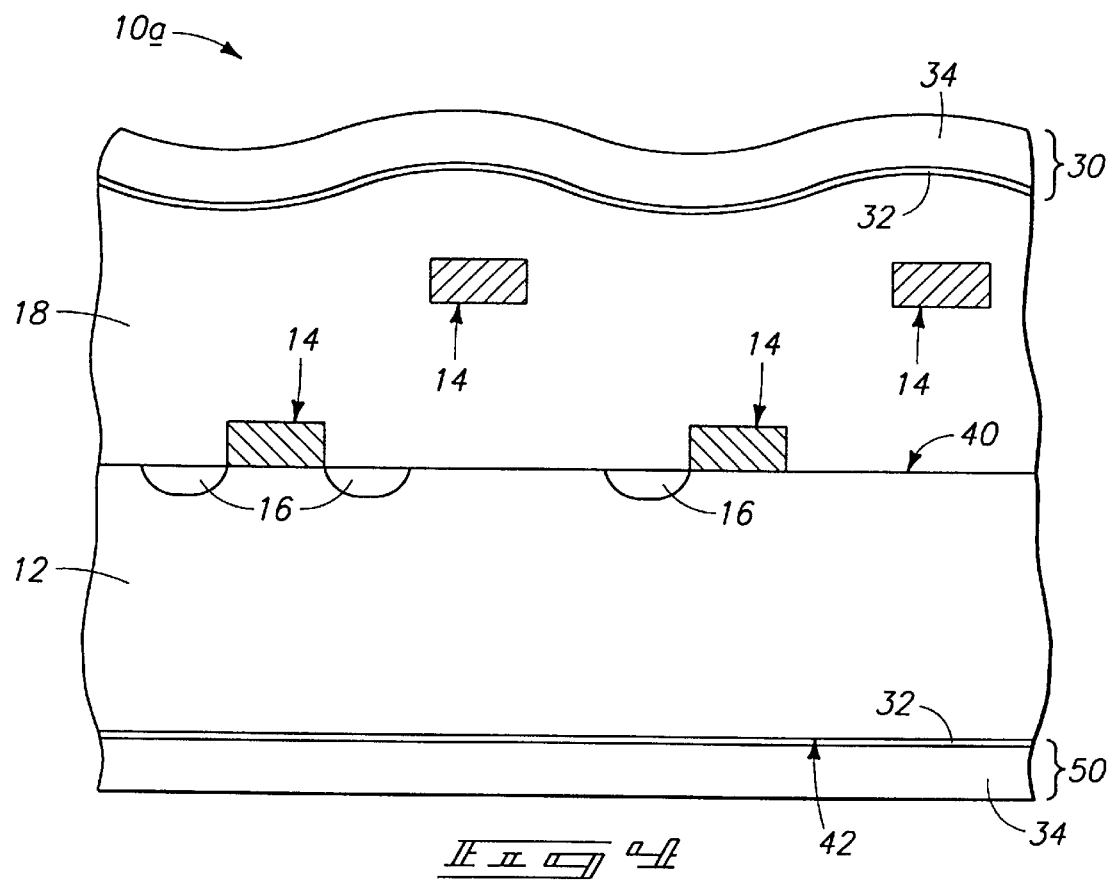
FIG. 4 is a cross-sectional, fragmentary, diagrammatic view of a semiconductor wafer fragment at a processing step of a second embodiment method of the present invention.

The embodiment discussed above with reference to FIGS. 1–3 utilizes a sacrificial mass over one surface of a semiconductive wafer. FIG. 4 illustrates a processing step of a second embodiment method wherein a sacrificial mass is formed over two surfaces of a semiconductive wafer. In referring to FIG. 4, similar numbering is utilized as was used in describing the embodiment of FIGS. 1–3, with differences indicated by the suffix "a", or by different numerals.

A semiconductor wafer fragment 10a is shown in FIG. 4. Wafer fragment 10a comprises a front surface 40 and an opposing back surface 42. Electronic components 14 are formed over front surface 40, and diffusion regions 16 are formed within front surface 40. Accordingly, electrical components 14 and diffusion regions 16 are associated with front surface 40, rather than with back surface 42. A first sacrificial mass 30 is formed over front surface 40, and a second sacrificial mass 50 is formed over back surface 42. In the shown embodiment, second sacrificial mass 50 comprises the same two layers (32 and 34) as first sacrificial mass 30. However, it is to be understood that in other embodiments of the invention (which are not shown) second sacrificial mass 50 can comprise different layers than first sacrificial mass 30. Thermal processing of electronic components 14 and diffusion regions 16 can occur through second sacrificial mass 50 by heating mass 50 and allowing energy to be transferred from mass 50 to substrate 12, and from substrate 12 to one or more of components 14 and diffusion regions 16. Mass 50 can be heated by, for example, exposing mass 50 to radiant energy.

The second embodiment processing step shown in FIG. 4 is similar to the first embodiment processing step shown in FIG. 3. A difference between the processing step of FIG. 4 and that of FIG. 3 is that the semiconductive wafer fragment 10 of FIG. 3 comprises only one sacrificial mass (30), whereas semiconductive wafer fragment 10a of FIG. 4 comprises two sacrificial masses (30 and 50). It is noted that the invention comprises other embodiments (not shown) wherein a semiconductive wafer comprises only one sacrificial mass, and the sacrificial mass is formed over a back surface of the wafer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A thermal processing method comprising:
   providing a semiconductor substrate, the semiconductor substrate supporting a material that is to be thermally processed;
   forming a first sacrificial layer over the semiconductor substrate;
   forming a second sacrificial layer over the first sacrificial layer, the second sacrificial layer comprising a different composition than the first sacrificial layer;
   exposing the second sacrificial layer to radiation to heat the second layer, the exposing being for a period of time sufficient for the material to absorb heat from the sacrificial layer and be thermally processed thereby;
   cooling the material and the sacrificial layers; and
   removing the sacrificial layers from over the semiconductor substrate.

2. The method of claim 1 wherein the semiconductor substrate comprises a front surface and an opposing back surface, and wherein the material is associated with the front surface, the sacrificial layers being provided over the front surface of the semiconductor substrate.

3. The method of claim 1 wherein the semiconductor substrate comprises a front surface and an opposing back surface, and wherein the material is associated with the front surface, the sacrificial layers being provided over the back surface of the semiconductor substrate.

4. The method of claim 1 wherein the semiconductor substrate comprises a front surface and an opposing back surface, and wherein the material is associated with the front surface, the sacrificial layers being provided over both the front surface and the back surface of the semiconductor substrate.

5. A thermal processing method comprising:
   providing a semiconductor substrate, the semiconductor substrate supporting a material that is to be thermally processed;
   forming a first sacrificial layer over the material;
   forming a second sacrificial layer over the first sacrificial layer, the second sacrificial layer comprising a different composition than the first sacrificial layer;
   exposing the second sacrificial layer to radiation to heat the second layer, the exposing being for a period of time sufficient for the material to absorb heat from the sacrificial layer and be thermally processed thereby;
   cooling the material and the sacrificial layers; and
   removing the sacrificial layers from over the material.

6. The method of claim 5 wherein the first sacrificial layer comprises titanium nitride, and further comprising forming a layer of silicon oxide over the material before forming the first sacrificial layer.

7. The method of claim 5 wherein the first sacrificial layer comprises titanium nitride and the second sacrificial layer comprises tungsten.

8. The method of claim 7 wherein the second sacrificial layer is physically against the first sacrificial layer.

9. The method of claim 5 wherein the first sacrificial layer comprises titanium nitride and the second sacrificial layer comprises silver.

10. The method of claim 9 wherein the second sacrificial layer is physically against, the first sacrificial layer.

11. The method of claim 5 wherein the first sacrificial layer comprises titanium nitride and the second sacrificial layer comprises gold.

12. The method of claim 11 wherein the second sacrificial layer is physically against the first sacrificial layer.

13. The method of claim 5 wherein the first sacrificial layer comprises titanium nitride and the second sacrificial layer comprises titanium.

14. The method of claim 13 wherein the second sacrificial layer is physically against the first sacrificial layer.

15. A rapid thermal processing method comprising:

providing a semiconductor substrate;

providing a material that is to be thermally processed over the semiconductor substrate;

chemical vapor depositing a sacrificial layer of titanium nitride over the material;

forming a second sacrificial layer over the sacrificial layer of titanium nitride;

exposing the second sacrificial layer to radiation to heat the second layer, the heating occurring at a ramp rate of from about 25° C./second to about 50° C./second, the exposing being for a period of time sufficient for the material to absorb heat from the sacrificial layer and be thermally processed thereby;

cooling the material and the sacrificial layers; and removing the sacrificial layers from over the material.

16. The method of claim 15 wherein the second sacrificial layer is heated to a temperature of at least about 800° C. before the cooling.

17. The method of claim 15 wherein the material comprises doped silicon.

18. The method of claim 15 wherein the material comprises titanium silicide.

19. The method of claim 15 wherein the period of time of the exposing is from about 5 seconds to about 1 minute.

20. The method of claim 15 wherein the depositing the sacrificial layer of titanium nitride comprises depositing the sacrificial layer of titanium nitride to a thickness of from about 150 Å to about 500 Å, and wherein the depositing the second sacrificial layer comprises depositing the second sacrificial layer to a thickness of at least about 500 Å.

21. The method of claim 15 further comprising forming a layer of silicon oxide over the material before depositing the sacrificial layer of titanium nitride.

22. The method of claim 15 wherein the second sacrificial layer comprises tungsten.

23. The method of claim 15 wherein the second sacrificial layer comprises tungsten and the forming the second sacrificial layer comprises sputter deposition.

24. The method of claim 15 wherein the second sacrificial layer comprises silver.

25. The method of claim 15 wherein the second sacrificial layer comprises gold.

26. The method of claim 15 wherein the second sacrificial layer comprises titanium.

* * * * *

UNITED STATES PATENT AND TRADEMARK OFFICE
CERTIFICATE OF CORRECTION

PATENT NO. : 6,287,927 B1  
DATED : September 11, 2001  
INVENTOR(S) : Robert Burke et al.

Page 1 of 1

It is certified that error appears in the above-identified patent and that said Letters Patent is hereby corrected as shown below:

<u>Column 1,</u>  
Line 66, delete "on e"; replace with -- one --

<u>Column 7,</u>  
Line 7, delete the "comma" after the word against

Signed and Sealed this

Nineteenth Day of March, 2002

Attest:

JAMES E. ROGAN  
*Director of the United States Patent and Trademark Office*

*Attesting Officer*